United States Patent [19]

Otsuka et al.

[11] Patent Number: 5,319,657
[45] Date of Patent: Jun. 7, 1994

[54] SEMICONDUCTOR LASER OF MODULATION DOPING QUANTUM WELL STRUCTURE WITH STOPPER AGAINST DOPANT DISPERSION AND MANUFACTURING METHOD THEREOF

[75] Inventors: Nobuyuki Otsuka, Hirakata; Masahiro Kito, Toyonaka; Masato Ishino, Shijonawate; Yasushi Matsui, Neyagawa, all of Japan

[73] Assignee: Matsushita Electric Industrial Co., Ltd., Osaka, Japan

[21] Appl. No.: 957,786

[22] Filed: Oct. 8, 1992

[30] Foreign Application Priority Data

Oct. 8, 1991 [JP] Japan .................................. 3-260038

[51] Int. Cl.⁵ .............................................. H01S 3/19
[52] U.S. Cl. ...................................... 372/43; 372/45
[58] Field of Search ...................................... 372/43–48

[56] References Cited

U.S. PATENT DOCUMENTS 4,953,170  8/1990  Logan et al. ............................ 372/44
5,073,892 12/1991  Uomi et al. ............................. 372/45
5,193,098  3/1993  Welch et al. ........................... 372/46
5,204,871  4/1993  Larkins .................................. 372/45
5,212,705  5/1993  Kahen et al. ........................... 372/46

OTHER PUBLICATIONS

Uomi et al., Appl. Phys. Lett. 51 (2), 13 Jul. 1987, pp. 78–80, "Ultrahigh relaxation oscillation frequency...".

Primary Examiner—John D. Lee
Attorney, Agent, or Firm—Wenderoth, Lind & Ponack

[57] ABSTRACT

The semiconductor laser comprises a Sn doped InP substrate 1, n-InGaAsP wave guide layer 2, 5 nm thick InGaAs well layer 3, 3.5 nm thick undoped InGaAsP layer 4, 3 nm thick p-InGaAsP modulation doping layer 5, 3.5 nm thick undoped InGaAsP layer 6, a modulation doping quantum well layer 7 with ten wells, a 90 nm thick p-InGaAsP layer 8, a p-InP clad layer 9 ($Zn = 7 \times 10^{17}$ cm$^{-3}$), p-n-p current block layer 10, and a mesa-shaped active layer region 11. An Au/sn n-electrode 12 and if Au/Zn p-electrode 13 are formed by vapor deposition to complete the laser structure.

12 Claims, 12 Drawing Sheets

SEMICONDUCTOR LASER OF MODULATION DOPING QUANTUM WELL STRUCTURE WITH STOPPER AGAINST DOPANT DISPERSION AND MANUFACTURING METHOD THEREOF

BACKGROUND OF THE INVENTION

1. Field of the Invention

The present invention relates to a high performance semiconductor laser required for optical fiber communications, and to a manufacturing method therefor.

2. Description of the Prior Art

Research into single quantum well (SQW) and multiple quantum well (MQW) lasers, devices in which a quantum well structure is used as the active layer of the semiconductor laser, has been pursued in hopes of improving the characteristics of the semiconductor laser. Semiconductor lasers featuring a quantum well active layer can be expected to provide characteristics superior to those of common bulk active layer lasers because of the quantum size effect. For example, high efficiency, high output operation is possible at a low threshold level by increasing differential gain and reducing transverse magnetic wave (TM) emissions, and high speed response and low chirping can be obtained by increasing the relaxation oscillation frequency and reducing the line width amplification coefficient.

The use of a modulation doping MQW structure in which doping is applied to the quantum well barrier layer is also being studied in addition to the application of a strained quantum well and thin film barrier layers when differential gain is further increased. [K. Uomi, T. Mishima, N. Chinone, Appl. Phys. Lett., 51 (2), 13 July 1987]

Figure 8:
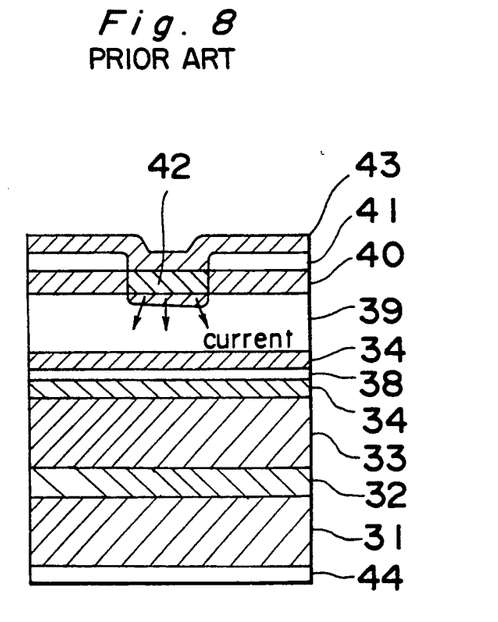
FIG. 8 is a cross section of a conventional modulation doping multiple quantum well laser, FIG. 9 (a) is a graph of the Be concentration distribution in a conventional modulation doping quantum well, FIG. 9 (b) is a cross section of a conventional modulation doping quantum well, FIG. 9 (c) is a cross section of a conventional modulation doping quantum well, FIG. 9 (d) is a cross section of a modulation doping quantum well when a laser is manufactured using a conventional modulation doping quantum well, FIGS. 10 (a)–10 (c) are a graph showing the retention of the modulation doping structure during growth of p-InP crystals.

A conventional semiconductor laser as shown in FIGS. 8 and 9 comprises an n-GaAs substrate 31, an n-GaAs buffer layer 32, an n-$Ga_{0.6}Al_{0.4}As$ clad layer 33, an undoped AlGaAs wave guide layer 34, an undoped GaAs well layer 35, an undoped $Ga_{0.8}Al_{0.2}As$ layer 36, Be-doped $Ga_{0.8}Al_{0.2}As$ layer 37, modulation doping quantum well layer 38, p-AlGaAs clad layer 39, n-GaAs current constriction layer 40, $SiO_2$ insulation layer 41, Zn diffusion region 42, an Au/Cr p-electrode 43, and an AuGeNi n-electrode 44.

Figure 9A:
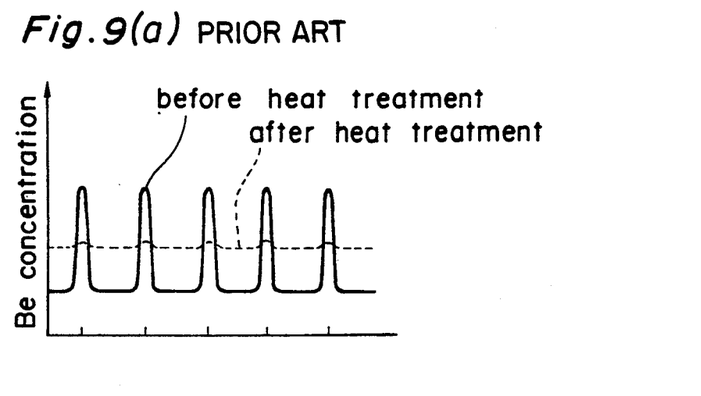
Figure 9B:
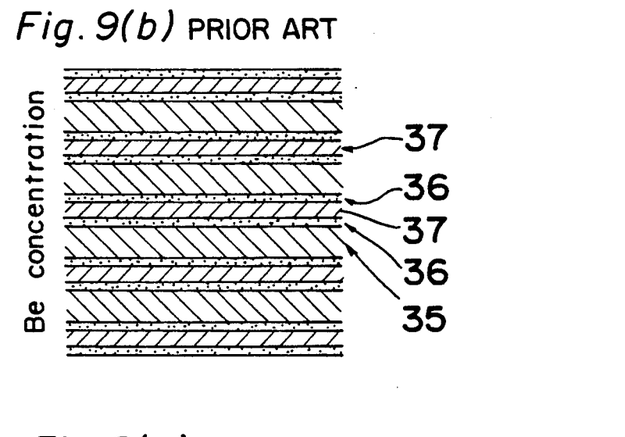
Figure 9C:
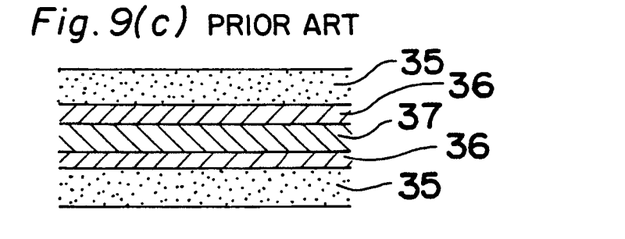
Figure 9D:
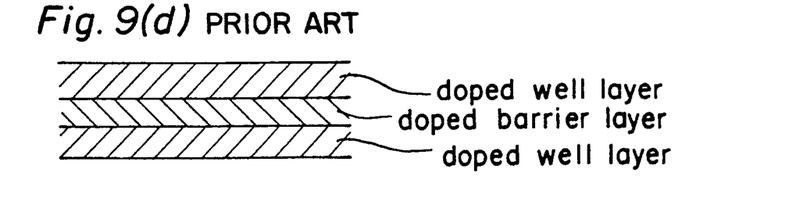

The modulation doping quantum well layer 38 shown in FIG. 8 consists of the undoped GaAs well layer 35, and a barrier layer formed by the undoped GaAlAs barrier layer 36 and modulation doping (Be-doped GaAlAs) layer 37, as shown in FIG. 9(b).

In a conventional modulation doping quantum well semiconductor laser device as described, the current is input from the p-electrode 43, constricted by the Zn diffusion region 42, and then input to the modulation doping quantum well layer 38. The relaxation oscillation frequency, which is increased by increasing the differential gain, is confirmed to be increased in the modulation doping quantum well structure shown in FIG. 8, but not in an undoped quantum well structure.

As described above, the modulation doping quantum well layer 38 in a modulation doping quantum well semiconductor laser device such as that shown in FIG. 8 consists of the undoped GaAs well layer 35, and a barrier layer formed by the undoped GaAlAs barrier layer 36 and modulation doping (Bedoped GaAlAs) layer 37.

Comparing the relaxation oscillation frequency of this semiconductor laser with a uniformly doped quantum well semiconductor laser in which the well layer and barrier layer are uniformly doped as shown in FIG. 9 (d), an equivalent increase in the relaxation oscillation frequency is confirmed in both semiconductor laser constructions relative to an undoped quantum well semiconductor laser device. The probable cause for this is that post-doping heat treatment of the modulation doping constructions shown in FIGS. 9 (b) and (c) disperses the doping elements, effectively eliminating the modulation doping structure, and resulting in a uniformly doped construction. This is shown in FIG. 9 (a). The modulation doping quantum well construction shown in FIG. 9 (b) has a high Be concentration only in the modulation doping layer before heat treatment, but a uniform Be concentration after heat treatment because of Be diffusion. As a result, there is no effective difference in the laser output of a uniform doping construction and a modulation doping construction. This is because the elements used for doping are diffused throughout the construction at high temperatures.

SUMMARY OF THE INVENTION

Therefore, an object of the present invention is to impart modulation doping, and to suppress the dispersion of the dopant element from the modulation doping quantum well layer having a modulation doping construction, thereby suppressing destruction of the modulation doping structure. A further object is to provide a semiconductor laser having a construction that suppresses dispersion of the dopant from the clad layer to the modulation doping quantum well layer, and suppresses destruction of the modulation doping structure in the modulation doping quantum well layer.

To achieve this object, a semiconductor laser according to the present invention is characterized by a construction comprising a single crystal substrate, a first wave guide layer, a modulation doping quantum well layer of alternating well layers and barrier layers, a second wave guide layer, and a clad layer. In this construction, the single crystal substrate comprises a first conductive type. The first wave guide layer is of the first conductive type and has an energy gap less than that of the single crystal substrate. The well layers have an energy gap less than that of the first wave guide layer. The barrier layers have an energy gap between that of the first wave guide layer and the well layers, and include in part a modulation doping layer having a second conductive type different from that of the single crystal substrate. The second wave guide layer has an energy gap greater than that of the barrier layer, and consists of a crystal with a greater dopant solution limit than the clad layer. The clad layer is of the second conductive type.

The manufacturing method for the semiconductor laser according to the present invention comprises a first crystal growth process for growing on the single crystal substrate comprising a first conductive type a first wave guide layer with an energy gap less than that of the single crystal substrate, a well layer with an energy gap less than that of is the first wave guide layer, an undoped first barrier layer with an energy gap between that of the first wave guide layer and the well layer, a modulation doping layer with a second conductive type which is the same as or different from that of the single crystal substrate, an undoped second barrier layer, a modulation doping quantum well layer of a well layer, first barrier layer, modulation doping layer, and second barrier layer, a second wave guide layer with an energy gap greater than that of the barrier layer, and a clad layer with an energy gap greater than that of the second wave guide layer and having a second conductive type; an etching process for etching a striped pattern to the single crystal substrate; and a second crystal growth process for growing a fifth crystal having the same structure and inverse conductive type as the crystal substrate, a sixth crystal having the same structure and same conductive type as the crystal substrate, and a seventh crystal having the same structure and inverse conductive type as the crystal substrate embedded in the stripe.

To retain the modulation doping structure it is first necessary for the concentration of the dopant added to the modulation doping layer to be less than the dopant saturation concentration of the crystal structure. However, it is possible for the modulation doping structure to be lost even when the amount of dopant in the modulation doping layer is less than the saturation level. This occurs when there is a layer with a dopant level greater than the saturation level near the modulation doping layer. It is therefore necessary to separate the low saturation level layer from the modulation doping layer, and to maintain the dopant level at less than the saturation level.

The present invention can prevent dopant diffusion even when the Zn concentration of the clad layer is less than the Zn saturation level or when Zn at near the saturation level is doped to the clad layer by inserting an undoped layer between the clad layer and the modulation doping layer. However, because it is necessary to dope inside the wave guide layers when manufacturing a laser structure, a modulation doping structure is maintained by the present invention, by substituting a low saturation level InP for the Zn dopant, and inserting, for example, an InGaAsP layer.

BRIEF DESCRIPTION OF THE DRAWINGS

The present invention will become more fully understood from the detailed description given below and the accompanying drawings wherein.

DESCRIPTION OF PREFERRED EMBODIMENTS

The following trial test was conducted in developing the present invention.

Figure 14:
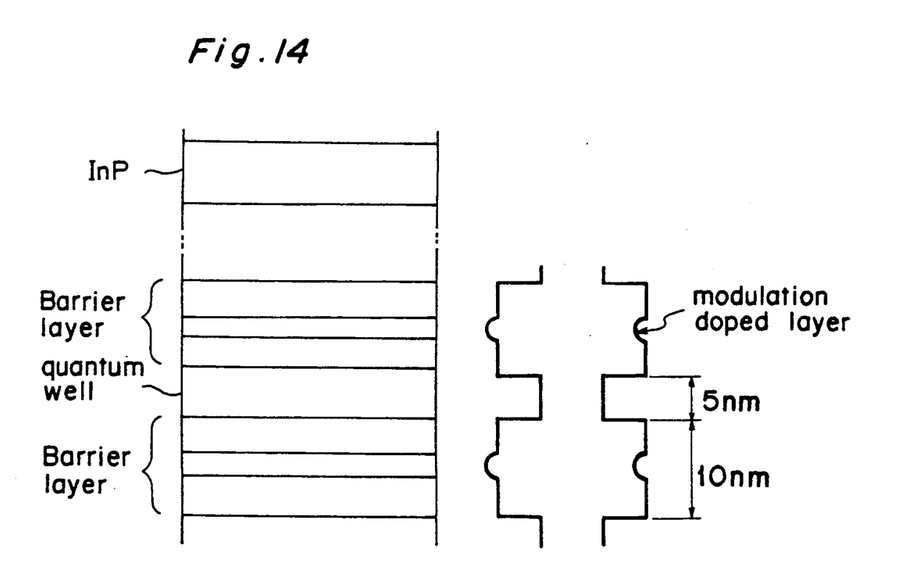
FIG. 14 is a cross section of a conventional modulation doping quantum well and energy levels.

Ten pairs of modulation doping MQW structures as shown in FIG. 14 were prepared. Each structure had a well layer thickness of 5 nm, and a barrier layer thickness of 10 nm. A 3 nm area at the middle of the barrier layer was Zn doped at $1 \times 10^{18}$ cm$^{-3}$. After these modulation doping structures were grown, a 300 nm thick p-InP layer was grown similar to a normal clad layer. The growth temperature was 620° C.; growth time was 90 min. After growth, the modulation doping structures were measured with SIMS, and it was confirmed that the modulation doping structure was retained.

However, to achieve a PBH structure (embedded laser structure), a current constriction layer was grown imbedded in the p-n-p-InP layer through liquid phase epitaxy, and the modulation doping structure was again measured with SIMS. This time, however, the modulation doping structure was not retained.

Figures 10A, 10B:
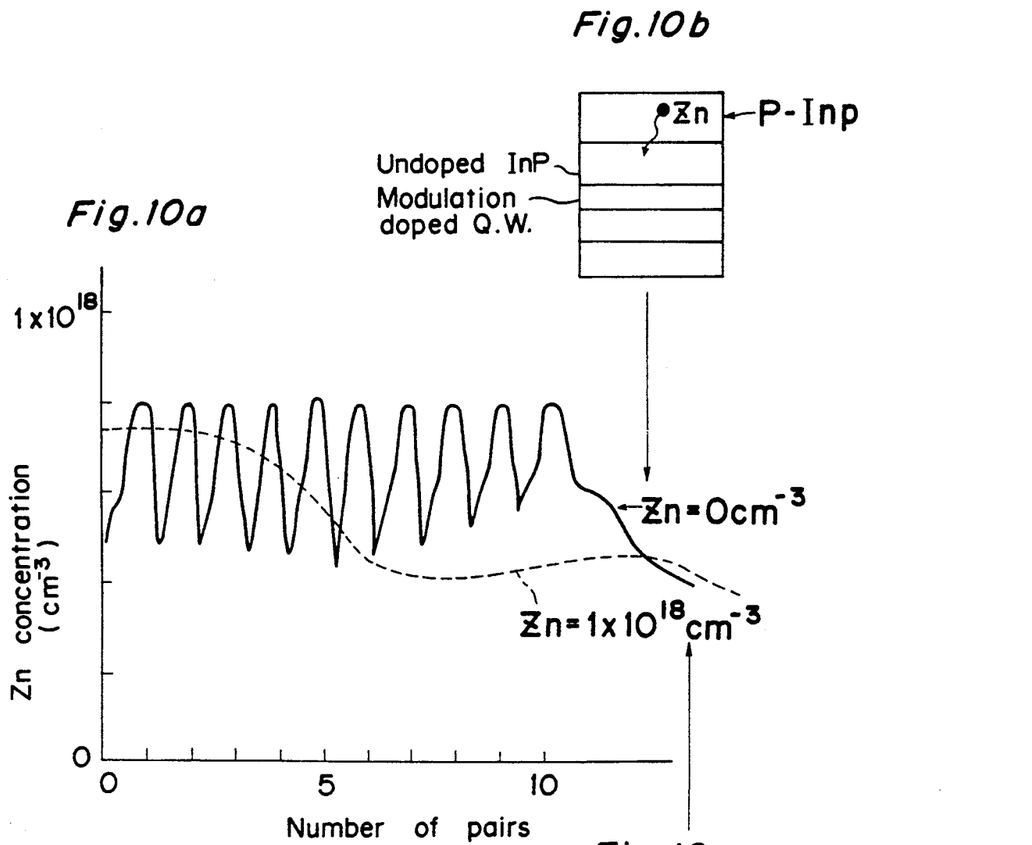

However, it was confirmed through SIMS measurements that the modulation doping structure is retained by growing the modulation doping structure, then growing a 300 nm undoped InP layer in place of the p-InP layer, and then growing the p-InP layer. See FIG. 10 (a).

Figure 10C:
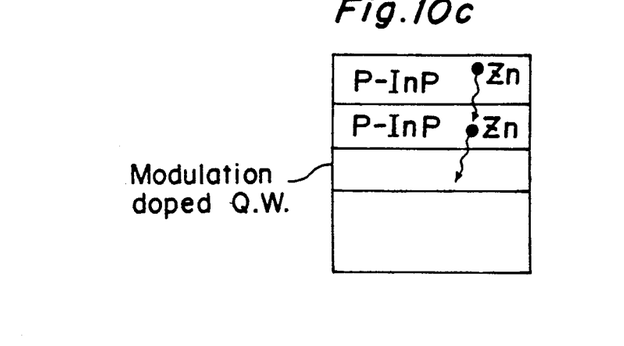

From the results shown in FIG. 10 (a), we know that the modulation doping structure is retained when the concentration of the InP layer grown after the modulation doping structure is grown (b) is 0, and the modulation doping structure is lost when the InP concentration is $1 \times 10^{18}$ cm$^{-3}$ (c). We therefore know that even if an undoped InP layer can be grown adjacent to the modulation doping layer, a doped p-InP crystal cannot be grown.

From these experimental results, when there is a doped p-InP clad layer adjacent to the modulation doping layer, the modulation doping structure is lost, but there is no change in the modulation doping structure when the p-InP clad layer is not doped. Dissipation of the modulation doping structure is believed to be due to the Zn doped to the clad layer being diffused as interstitial Zni atoms through the modulation doping layer, thus destroying the modulation doping structure. It follows that there are two ways of retaining the modulation doping structure.

Figure 3A:
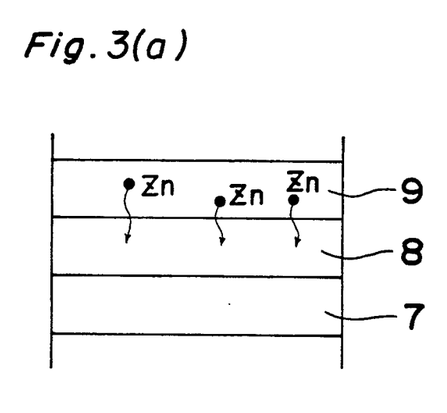

(1) As shown in FIG. 3 (a), the doped p-InP layer 9 is separated from the modulation doping quantum well layer 7, reducing the number of interstitial Zni atoms of the Zn diffused from the p-InP layer 9. A p-InGaAsP layer 8 that stops Zn diffusion is provided below the p-InP clad layer 9. This p-InGaAsP layer 8 also functions as a second wave guide layer. Because the Zn solution limit of the p-InGaAsP layer 8 is high, any Zn that may be diffused from the p-InP layer 9 will be stopped by the p-InGaAsP layer 8. As a result, the p-InGaAsP layer 8 functions as a low resistance layer between the p-InP clad layer 9 and the modulation doping quantum well layer 7 without producing any interstitial Zni atoms.

Figure 3B:
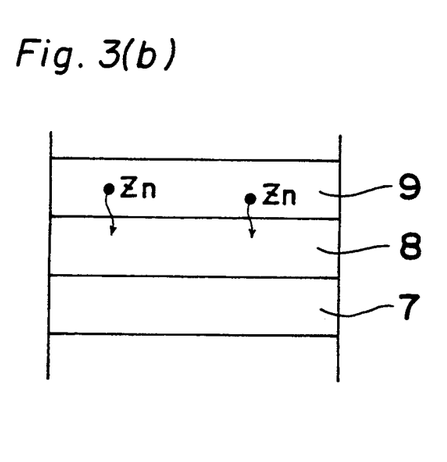

(2) As shown in FIG. 3 (b), the Zn concentration of the p-InP layer 9 is lowered. The quantity of Zn soluble in the p-InP layer 9 is dependent on the crystal growth temperature and the total gas quantity during crystal growth, but is believed to be approximately $1 \times 10^{18}$ cm$^{-3}$. When a concentration near the solution limit is used, a large quantity of interstitial Zni atoms is produced. As a result, it is necessary to dope the p-InP layer 9 at approximately $5 \times 10^{17}$ cm$^{-3}$, a level at which virtually no interstitial Zni atoms are produced.

These two methods are means of preventing the diffusion of Zn to the modulation doping quantum well layer from outside this layer. These means alone can prevent the doping element from being diffused through the modulation doping layer from a source outside the modulation doping layer, but cannot prevent the element doped to the modulation doping layer from diffusing and destroying the modulation doping layer.

Figure 4A:
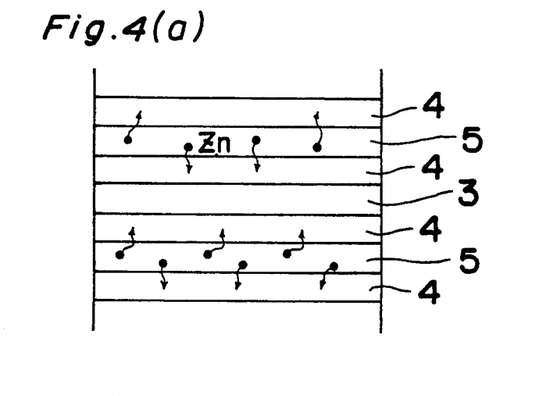

It is therefore necessary to complement the above methods with a means, as shown in FIG. 4 (a), of preventing diffusion of the doping element (Zn) in the modulation doping layer from the modulation doping layer to the outside thereof. There are three possible methods of achieving this.

Figure 11:
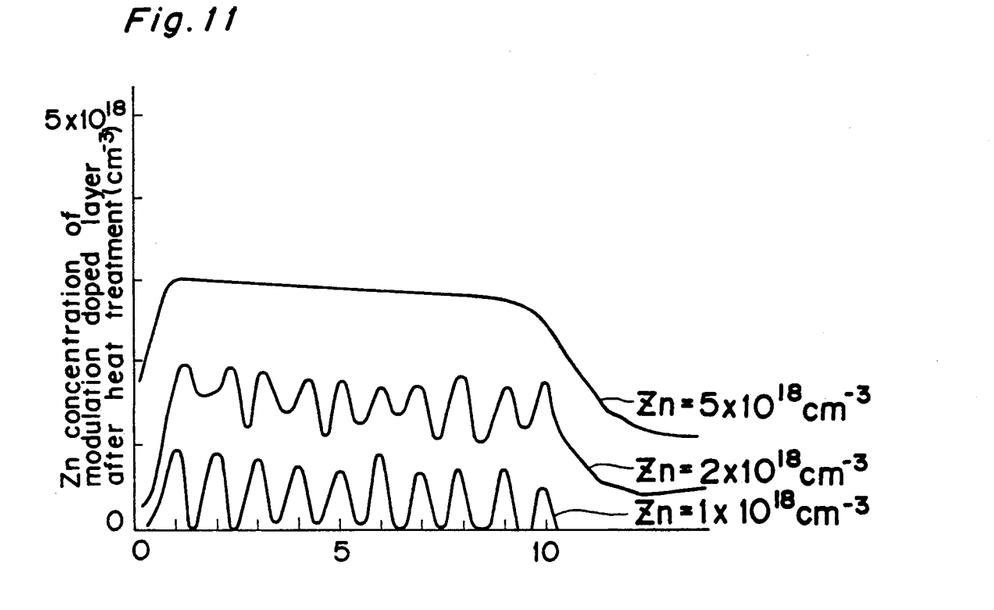
FIG. 11 is a graph of the relationship between modulation doping concentration and modulation doping structure retention.

(1) The modulation doping concentration of the p-InGaAsP modulation doping layer 5 is less than the InGaAsP crystal solution limit. This is because, as described above with respect to the p-InP clad layer 9, when Zn doping exceeds the solution limit, the modulation doping layer is dissipated because of the interstitial Zni atoms emitted from the modulation doping layer itself. FIG. 11 shows the change in the modulation doping structure for a p-InGaAsP modulation doping layer 5 Zn concentration of $1 \times 10^{18}$ cm$^{-3}$, $2 \times 10^{18}$ cm$^{-3}$, and $5 \times 10^{18}$ cm$^{-3}$. We know from these results that the modulation doping structure is retained at a Zn concentration less than $2 \times 10^{18}$ cm$^{-3}$, and that it is therefore necessary to keep the Zn concentration less than $2 \times 10^{18}$ cm$^{-3}$.

(2) Because modulation doping is applied to the p-InGaAsP modulation doping layer 5, there is a natural tendency for Zn to be dispersed from this layer when the Zn concentration is high. It should be possible to prevent this dispersion if the crystal energy of the p-InGaAsP modulation doping layer 5 is increased and made unstable by Zn diffusion.

For example, if the lattice constant of the crystal in the modulation doping layer is greater than the lattice constant of the adjacent barrier layer, compressive strain will occur in the modulation doping layer, producing an unstable state with an increase in the internal energy of the crystals. However, because the lattice constant of the modulation doping layer decreases as the concentration of the Zn doping increases, Zn doping effectively reduces compressive strain and the crystals stabilize.

In other words, if compressive strain is first applied to the modulation doping layer (the lattice constant of the modulation doping layer is made greater than that of the adjacent barrier layer), Zn diffusion from the modulation doping layer will result in an increase in crystal energy because of the drop in Zn concentration, and Zn diffusion will be suppressed. Therefore, Zn diffusion to the undoped InGaAsP layer can be suppressed by making the lattice constant of the modulation doping layer greater than the lattice constant of the adjacent barrier layer. In this case, the concentration of Zn added to the modulation doping layer can be increased to $5 \times 10^{18}$ cm$^{-3}$.

Figure 4B:
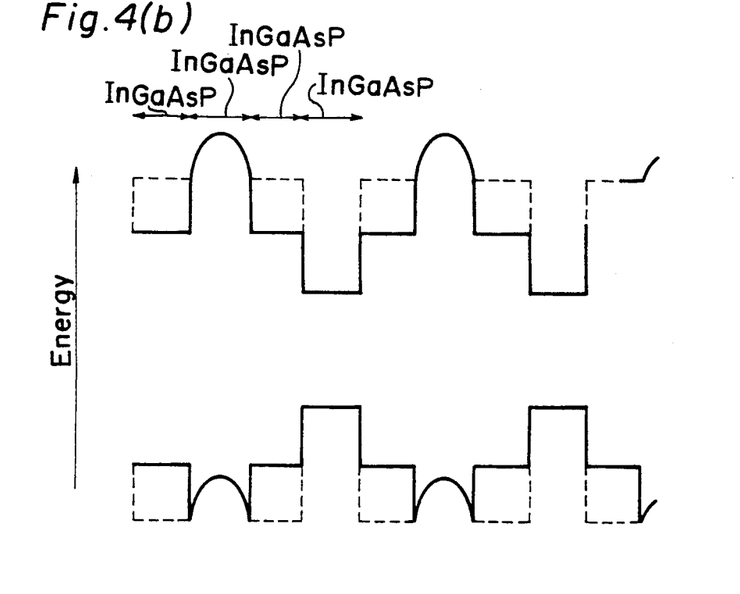
Figure 4C:
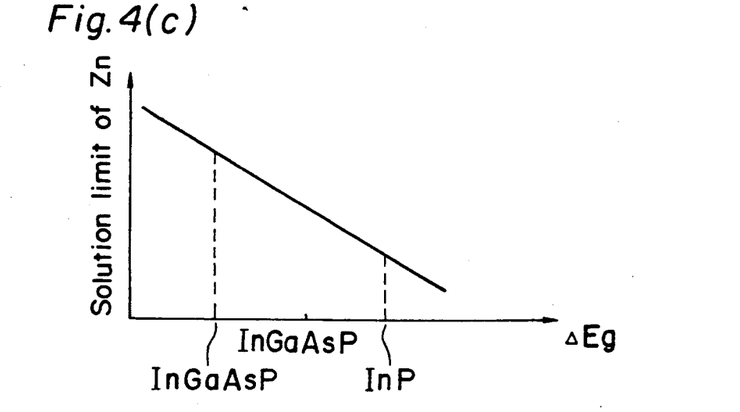

(3) The energy state of the well layer and barrier layers of the modulation doping quantum well layer are shown in FIG. 4 (b). As shown in FIG. 4 (c), a higher Zn saturation level can be achieved in the InGaAsP crystals forming the barrier layer with a crystal structure having a low energy gap. However, when the energy gap of the barrier layer crystals is reduced, the difference between the energy gaps of the well layer and the barrier layer decreases, electrons supplied to the laser leak from the well layer, and the emission efficiency drops. By using a low energy gap, high Zn saturation level crystal for the undoped InGaAsP layer 4 only without reducing the energy gap of the p-InGaAsP modulation doping layer 5 in the barrier layer, Zn atoms escaping from the -p-InGaAsP modulation doping layer 5 can be stopped by the undoped InGaAsP layer 4. Specifically, by forming the undoped InGaAsP layer 4 between the p-InGaAsP modulation doping layer 5 structure and the well layer 3 structure of the barrier layer, the Zn solution limit of the undoped InGaAsP layer 4 is increased and Zn diffusion can be suppressed. It is possible in this case to increase the Zn concentration in the modulation doping layer to $8 \times 10^{18}$ cm$^{-3}$.

In addition, by structuring the barrier layer from a high energy gap undoped layer sandwiched between two low energy gap modulation doping layers, the Zn doping concentration can be increased in a structure with a high energy gap in the well layer and barrier layer.

Moreover, the Zn doping concentration can also be increased in a construction with a high energy gap in the well layer and barrier layers by using a low energy gap modulation doping layer and a high energy gap undoped layer.

The preferred embodiments of the invention are described below with reference to the accompanying figures.

First Embodiment

Figure 1:
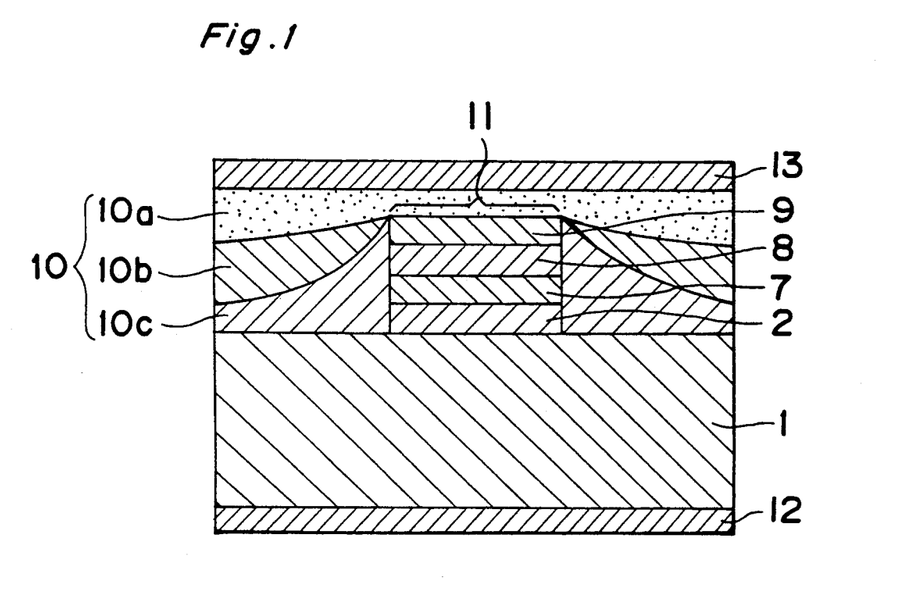
FIG. 1 is a cross section of a modulation doping multiple quantum well laser according to the first embodiment of the invention.
Figure 2:
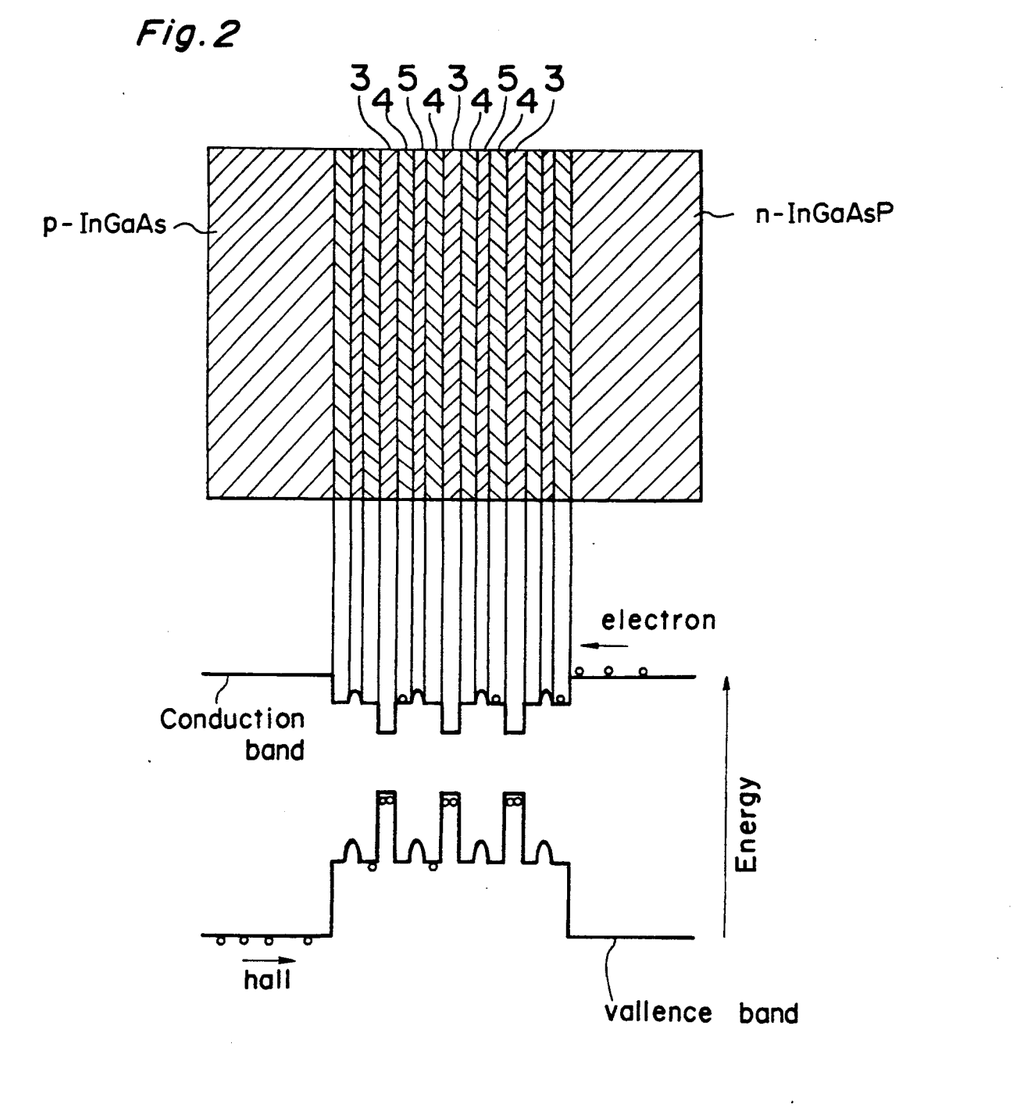
FIG. 2 shows the structure of the modulation doping quantum well layer and the corresponding energy states thereof, FIGS. 3 (a) and 3 (b) show the behavior of the Zn dopant in the clad layer and Zn stopping layer, FIG. 4 (a) shows the behavior of the Zn dopant in the modulation doping layer, FIG. 4 (b) shows the energy states of the modulation doping layer, FIG. 4 (c) shows the relationship between the energy gap and the Zn saturation level, FIGS. 5 (a) and 5 (b) are cross sections of a modulation doping multiple quantum well laser according to the second embodiment of the invention, FIGS. 6 (a) and 6 (b) are cross sections of a modulation doping multiple quantum well laser according to the third embodiment of the invention, FIGS. 7 (a)–7 (d) are a cross section of the manufacturing process for a modulation doping multiple quantum well laser according to the fourth embodiment of the invention.

FIG. 1 is a cross section of a strain quantum well semiconductor laser device according to the present invention. As shown in FIGS. 1 and 2, this semiconductor laser device comprises an Sn doped InP substrate 1, n-InGaAsP wave guide layer 2, 5 nm thick InGaAs well layer 3, 3.5 nm thick undoped InGaAsP layer 4, 3 nm thick p-InGaAsP modulation doping layer 5, 3.5 nm thick undoped InGaAsP layer 6, a modulation doping quantum well layer 7 with ten wells, a 90 nm thick p-InGaAsP layer 8, a p-InP clad layer 9 (Zn=$7 \times 10^{17}$ cm$^{-3}$), p-n-p current block layer 10, a mesa-shaped active layer region 11, Au/Sn n-terminal 12, and Au/Zn p-terminal 13.

FIG. 2 is a detailed illustration of the modulation doping quantum well layer and the energy states thereof. As shown in FIG. 2, the modulation doping quantum well layer 7 comprises the InGaAs well layer 3 and a barrier layer formed by the undoped InGaAsP layer 4 and the p-InGaAsP modulation doping layer 5.

The operation of this semiconductor laser construction according to the present invention is described below with reference to FIG. 1. The current input from the p-terminal 13 is constricted by the p-n-p current block layer 10, and is then injected to the modulation doping quantum well layer 7.

The p-InGaAsP modulation doping layer 5 is Zn doped to $2 \times 10^{18}$ cm$^{-3}$. As shown in FIG. 11, this doping level does not result in destruction of the p-InGaAsP modulation doping layer 5.

The film thickness of the well layer was set at 5 nm so that a 1.55 μm wavelength emission is obtained from the well layer structure. In this first embodiment, the p-InGaAsP layer 8 is inserted between the p-InP clad layer 9 and the modulation doping quantum well layer 7. By thus suppressing Zn diffusion from the p-InP clad layer 9, the interstitial Zn$_i$ atom concentration in the p-InGaAsP layer 8 is minimized, and the Zn profile of the modulation doping layer in the modulation doping quantum well layer 7 is retained.

After production of this laser and measuring various characteristics thereof, the relaxation oscillation frequency was 10 GHz/$\sqrt{\text{mw}}$, an increase of 1.7 times over the 6 GHz/$\sqrt{\text{mw}}$ of a structure identical except for the absence of modulation doping. This is attributable to an increase in differential gain from the application of the modulation doping structure.

Second Embodiment

A second embodiment of a strain quantum well semiconductor laser device according to the invention is described next.

Figures 5A, 5B:
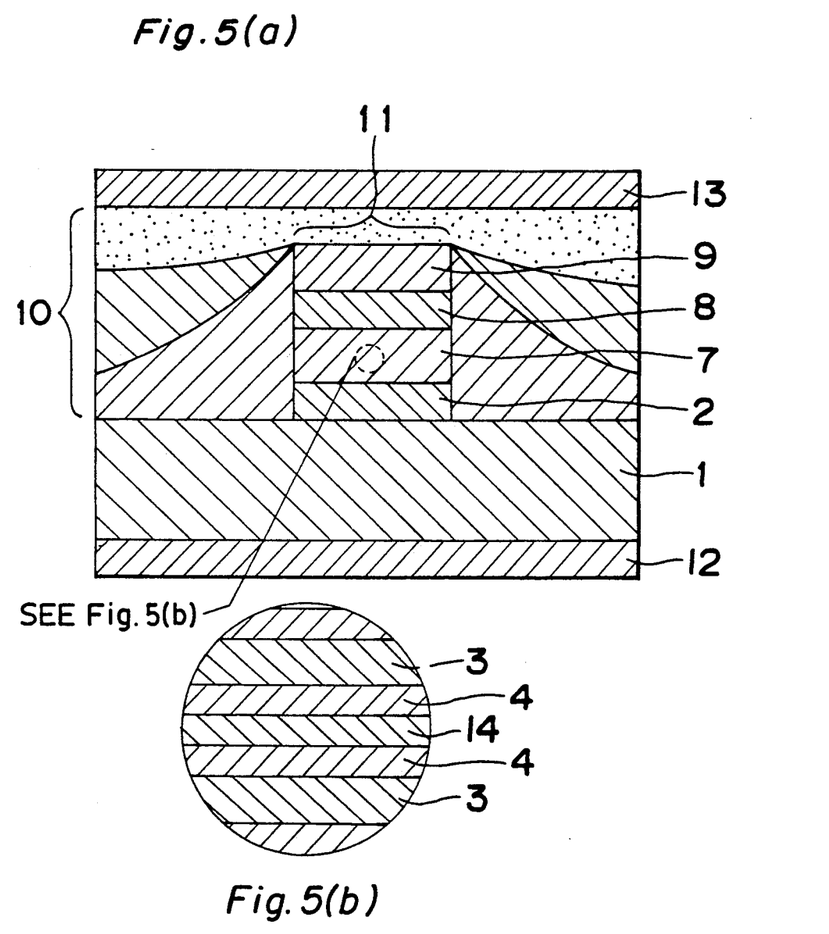

FIG. 5 is a cross section of this second embodiment of a strain quantum well semiconductor laser device. This embodiment differs from the first in that the p-InGaAsP modulation doping layer 5 shown in FIG. 1 is replaced with an In$_{0.76}$Ga$_{0.24}$As$_{0.61}$P$_{0.39}$ strain modulation doping layer 14 to produce a +0.5% compressive strain. As a result, the modulation doping concentration of the strain modulation doping layer 14 is $5 \times 10^{18}$ cm$^{-3}$ due to the adjacent barrier layer. As shown in FIG. 11, the modulation doping layer is normally destroyed at this doping level, but because compressive strain is imparted to the modulation doping layer in the form of the In$_{0.76}$Ga$_{0.24}$As$_{0.61}$P$_{0.39}$ strain modulation doping layer 14 in this embodiment, the doping level can be increased and the modulation doping layer is not destroyed.

Because Zn diffusion is suppressed in the modulation doping layer of this semiconductor laser construction, the Zn doping level can be increased to 2.5 times that of the first embodiment described above. As a result, the relaxation oscillation frequency f$_r$ is further improved to 13 GHz/$\sqrt{\text{mw}}$.

Third Embodiment

A third embodiment of a strain quantum well semiconductor laser device according to the invention is described next.

Figures 6A, 6B:
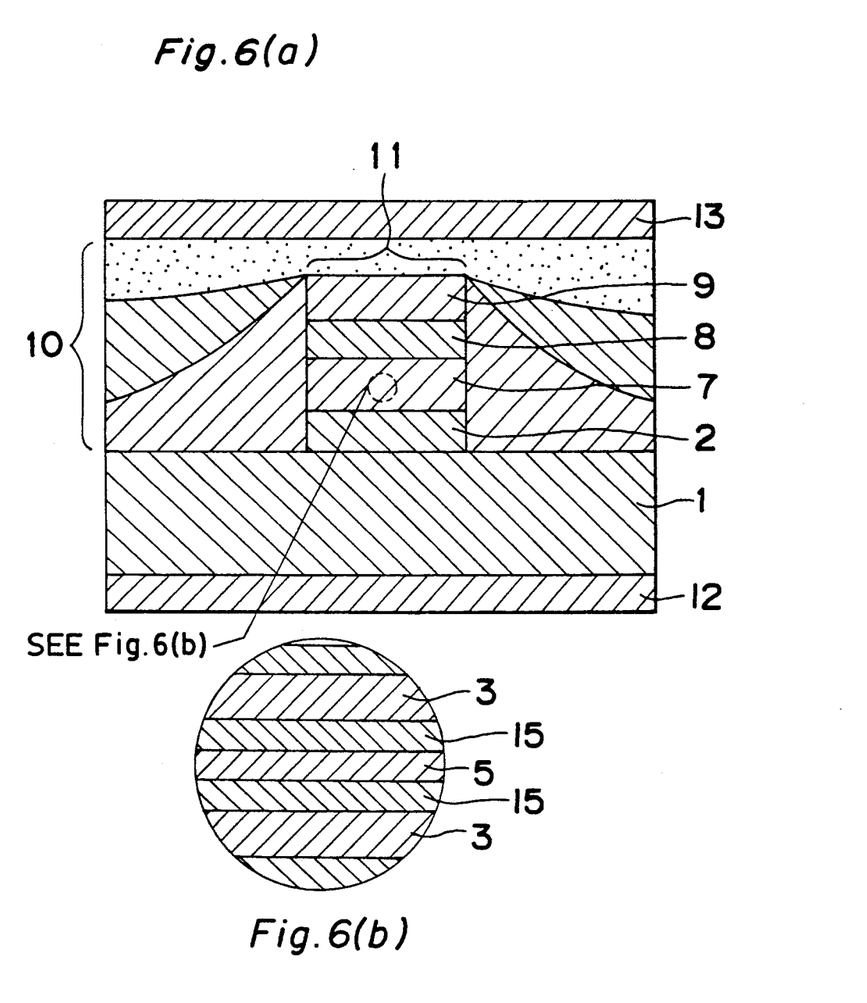

FIG. 6 is a cross section of this third embodiment of a strain quantum well semiconductor laser device. In this embodiment the structure of the undoped InGaAsP layer 4 adjacent to the p-InGaAsP strain modulation doping layer 14 shown in FIG. 5 is a stepped barrier layer 15 with a structure between that of the modulation doping layer and the well layer. This stepped barrier layer 15 increases the Zn solution limit of the undoped InGaAsP layer, and suppresses diffusion. The modulation doping concentration is $8 \times 10^{18}$ cm$^{-3}$. While this doping level exceeds the level at which the modulation doping layer is destroyed as shown in FIG. 11, it is possible to increase the doping added to the modulation doping layer by making the layer adjacent to the p-InGaAsP modulation doping layer 5 a stepped barrier layer 15.

Because Zn diffusion is suppressed in the modulation doping layer of this semiconductor laser construction, the Zn doping level can be increased to 4 times that of the first embodiment described above. As a result, the relaxation oscillation frequency f$_r$ is further improved to 15 GHz/$\sqrt{\text{mw}}$.

Fourth Embodiment

The manufacturing method for a semiconductor laser according to the present invention is shown in FIG. 7.

Figure 7A:
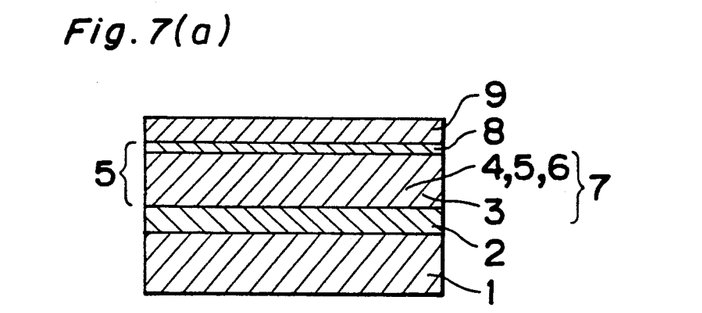
Figure 7B:
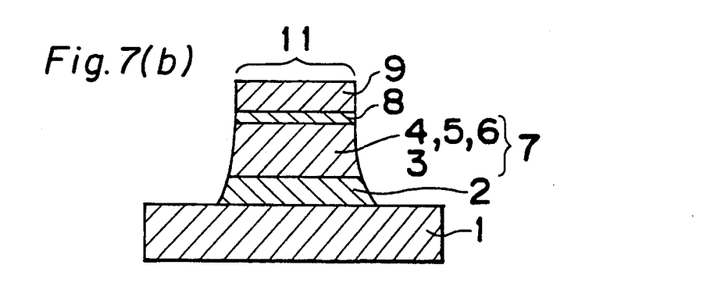
Figure 7C:
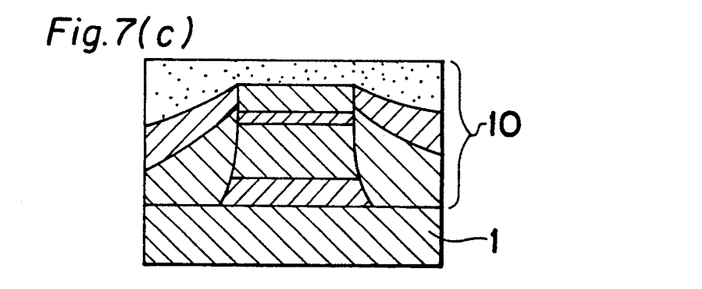
Figure 7D:
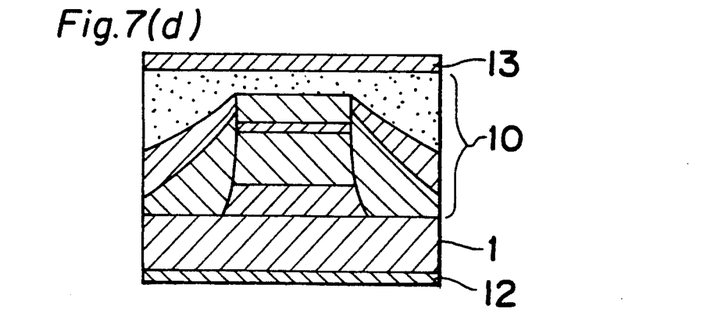

First, a 60 nm thick n-InGaAsP wave guide layer 2 is grown on the Sn doped InP substrate 1 using MOVPE. The modulation doping quantum well layer 7 is next grown in a layered growth process to form ten wells. In this growth process a layer group consisting of the 5 nm thick InGaAs well layer 3, 3.5 nm thick undoped InGaAsP layer 4, 3 nm thick p-InGaAsP modulation doping layer 5, and 3.5 nm thick undoped InGaAsP layer 6 is formed, a InGaAs well layer 3 is grown, and the three-layer barrier layer of layers 4-6 is formed. Growth of this sequence is repeated ten times to form the ten wells of the modulation doping quantum well layer 7.

The p-InGaAsP layer 8 (Zn=$5 \times 10^{17}$ cm$^{-3}$) and p-InP clad layer 9 (Zn=$5 \times 10^{17}$ cm$^{-3}$) are then grown consecutively as the Zn stopping layer, completing the crystal growth process (FIG. 7 (a)).

Next comes the mesa etching process (FIG. 7 (b)) in which the n-InGaAsP wave guide layer 2 is etched from the p-InP clad layer 9 as the mesa-shaped active layer region 11.

The p-InP, n-InP, P-InP p-n-p current block layer 10 is then grown embedded by MOVPE (FIG. 7 (c)).

Finally, the laser structure is obtained in the terminal vapor deposition process (FIG. 7 (d)) in which the n-electrode 12 and p-electrode 13 are formed by vapor deposition.

The Zn concentration of the p-InGaAsP modulation doping layer 5 and the p-InP clad layer 9 in the embodiments thus manufactured is determined as follows.

Figure 12:
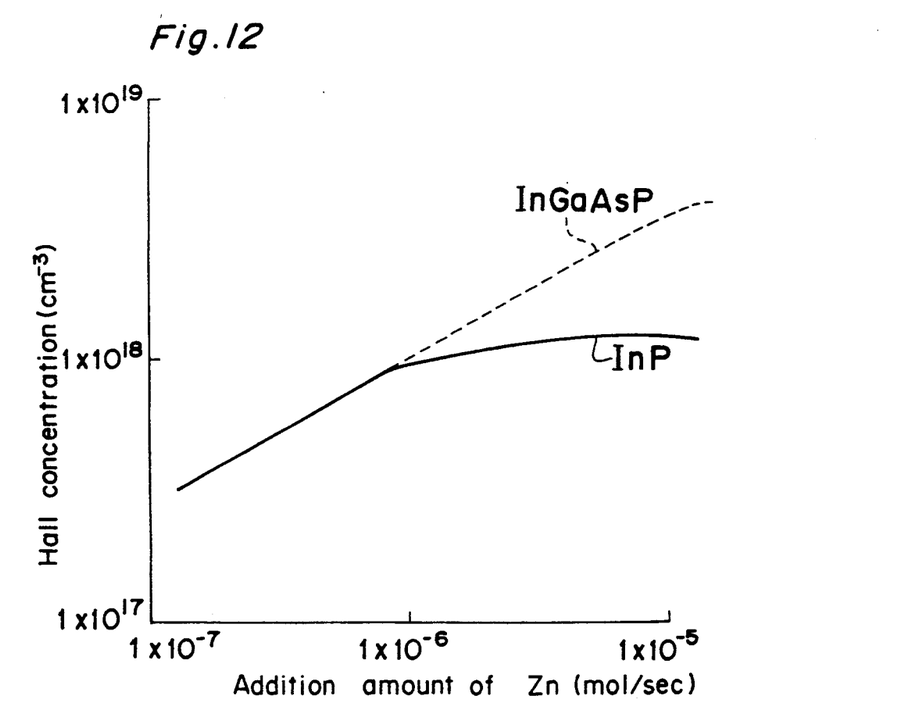
FIG. 12 is a graph of the relationship between Hall concentration and DMZn flow to InP and InGaAsP.
Figure 13:
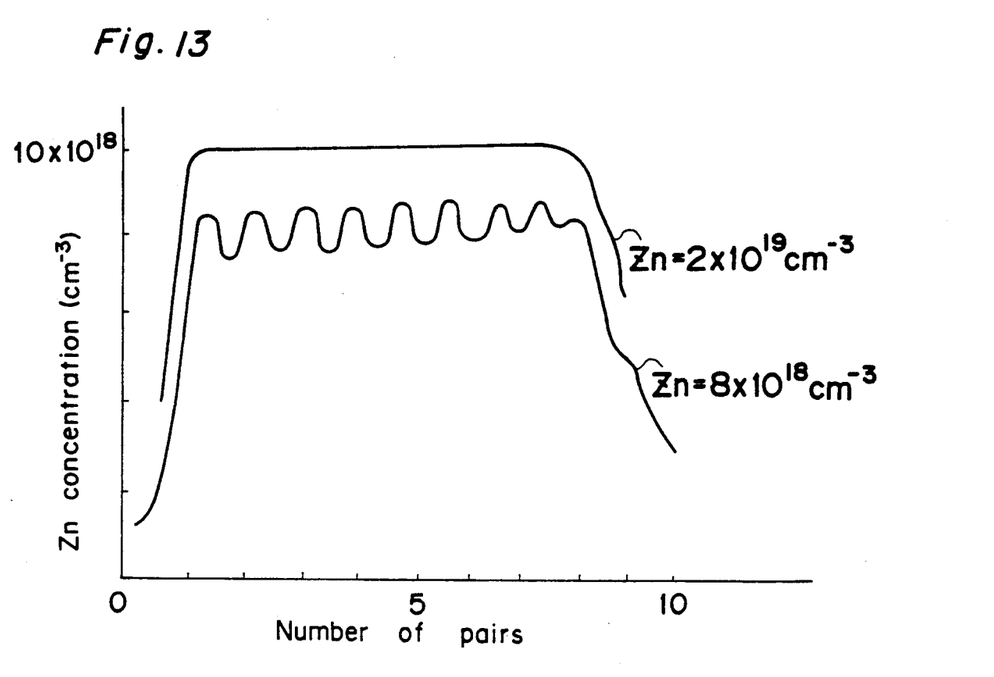
FIG. 13 is a graph of the relationship between modulation doping concentration and modulation doping structure retention.

The relationship between DMZN (dimetal zinc) flow, and hall concentration is shown in FIG. 12. InP is saturated at a hall concentration of $9 \times 10^{17}$ cm$^{-3}$, and InGaAsP is saturated at $5 \times 10^{18}$ cm$^{-3}$. Therefore, the Zn doping concentration in InP is half the saturation level, or $5 \times 10^{17}$ cm$^{-3}$, and is $3 \times 10^{18}$ cm$^{-3}$ in InGaAsP. The total flow is 5 L/min, and the growth temperature is 640° C.

A semiconductor laser according to the first embodiment described above can be obtained by this manufacturing process.

The manufacturing process for the second and third semiconductor lasers is essentially the same. What differs is that the InGaAsP strain modulation doping layer 14 is grovel in place of the modulation doping layer, and in the third embodiment the undoped barrier layer is grown as an undoped InGaAsP stepped barrier layer.

It is to be noted that while InP-compound semiconductor crystals are used by way of example in the descriptions above, other semiconducting crystal materials, including Si, GaAs, ZnSeS, InAlAs, AlGaAs, and InGaAsP can also be used. In addition, Zn is used as the dopant, but Be, Mg, Cd, Se, S, Te, and C can also be used. The laser structure is an DH laser above, but application to other high-added value lasers, including DFB and DBR lacers, is also possible.

The active layer structure is also described as a PBH structure but other structures can be used. Furthermore, the modulation doping structure of these embodiments is applied to semiconductor lasers, but application in wave guides, optical receptors, and other devices is also possible. In addition, p-InGaAsP is used as the Zn stopping layer, but undoped InP, undoped InGaAsP, and grated undoped InGaAsP can also be used.

While the embodiments of the present invention are applied to lasers, the invention is applicable to any electronic device in which doping is used, including HEMT, HFET, and HBT.

The crystal growth method was also described as MOVPE, but LPE, gas source MBE, MOMBE, hydride VPE, and other growth methods can also be used. In addition, the manufacturing method of the invention was described with respect to a semiconductor laser, but the same method can also be used to produce an optical wave guide.

An n-substrate is used for conductivity in the crystal substrate. A p-substrate is used to reduce the contact resistance between the semiconducting body and the metallic p-electrode in a high optical output laser device, and the invention remains applicable by simply using a p-type additive element.

Furthermore, the dopant added to achieve the modulation doping structure was described as a p-type dopant, but an n-type dopant can also be used.

As described above, differential gain can be increased, and a low threshold, high slope efficiency, high operating speed, low distortion semiconductor laser can be achieved by providing a dopant diffusion stopping layer formed by crystals with a higher energy gap than the well layer and a dopant solution limit greater than the clad layer to form a modulation doping structure that suppresses dopant dispersion.

In addition, the region of highest optical output is at the center of the quantum well layer, the light confinement factor $\Gamma$ is improved, and optical output increased because the wave guide layer is on both sides of the quantum well layer.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor laser comprising a compound semiconductor substrate with a first conductive type,
    a first wave guide layer formed on the substrate,
    a modulation doping quantum well layer of alternating well layers and barrier layers with the barrier layers modulation doped,
    a stopping layer for stopping dopant diffusion,
    and a second conductive clad layer,
    wherein the energy gap of the first wave guide layer is equal to or less than the energy gap of the substrate,
    the energy gap of each of the well layers is less than the energy gap of the first wave guide layer,
    the energy gap of each of the barrier layers is between that of the first wave guide layer and that of each of the well layers, and includes in part a modulation doping layer with the same or different conductive type as the substrate,
    the energy gap of the stopping layer is equal to or greater than the energy gap of each of the barrier layers, and is a crystal to which the dopant is added at less than the solution limit thereof.

2. A semiconductor laser according to claim 1 wherein the dopant level of the clad layer is less than the solution limit.

3. A semiconductor laser according to claim 2 wherein the dopant level of the barrier layers is less than the solution limit.

4. A semiconductor laser according to claim 3 wherein the modulation doping layer has an irregular lattice.

5. A semiconductor laser according to claim 3 wherein the energy gap of the modulation doping layer is different from the energy gap of each of the barrier layers.

6. A semiconductor laser according to claim 3 wherein the conductive type of the compound semiconductor substrate and the conductive type of the modulation doping layer of each of the barrier layers are both p-type.

7. A semiconductor laser according to claim 2 wherein the modulation doping layer has an irregular lattice.

8. A semiconductor laser according to claim 7 wherein the conductive type of the compound semiconductor substrate and the conductive type of the modulation doping layer of each of the barrier layers are both p-type.

9. A semiconductor laser according to claim 2 wherein the energy gap of the modulation doping layer is different from the energy gap of each of the barrier layers.

10. A semiconductor laser according to claim 9 wherein the conductive type of the compound semiconductor substrate and the conductive type of the modulation doping layer of each of the barrier layers are both p-type.

11. A semiconductor laser according to claim 2 wherein the conductive type of the compound semiconductor substrate and the conductive type of the modulation doping layer of each of the barrier layers are both p-type.

12. A method for manufacturing semiconductor lasers comprising the steps of
    growing a first wave guide layer on a compound semiconductor substrate of a first conductive type, said first wave guide layer having an energy gap less than that of the compound semiconductor substrate,
    growing a modulation doping quantum well layer on said first wave guide layer, said modulation doping quantum well layer having a layered structure wherein a well layer having an energy gap less than that of said first wave guide layer, an undoped first barrier layer having an energy gap substantially equal to one of intermediate energy gaps of said well layer, a doping modulation layer and an undoped second layer are laminated alternatively, growing a stopping layer for stopping dopant dispersion on said modulation doping quantum well layer, said stopping layer having an energy gap greater than that of each of said barrier layers, growing a clad layer of a second conductive type on said stopping layer, said clad layer having an energy gap larger than that of said stopping layer, etching all layers from said clad layer to said substrate to form a stripe pattern on said substrate, and growing a second type crystal layer, first type crystal layer and second type crystal layer at both sides of said stripe pattern on said substrate successively so that said stripe pattern is embedded between side walls formed with three crystal layers grown at the preceding step.

* * * * *